(12) United States Patent
Song

(10) Patent No.: US 9,257,990 B2
(45) Date of Patent: Feb. 9, 2016

(54) CLOCK DIVIDING DEVICE

(71) Applicant: Samsung Electronics Co., Ltd., Suwon-si, Gyeonggi-do (KR)

(72) Inventor: Jin-Ook Song, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/543,921

(22) Filed: Nov. 18, 2014

(65) Prior Publication Data

US 2015/0236701 A1 Aug. 20, 2015

(30) Foreign Application Priority Data

Feb. 14, 2014 (KR) ........................ 10-2014-0017222

(51) Int. Cl.
| H03K 21/00 | (2006.01) |
| H03K 23/68 | (2006.01) |
| H03K 21/02 | (2006.01) |
| H03K 21/10 | (2006.01) |

(52) U.S. Cl.
CPC ................ *H03K 21/02* (2013.01); *H03K 21/10* (2013.01); *H03K 23/68* (2013.01)

(58) Field of Classification Search
CPC ........ H03K 21/00; H03K 21/08; H03K 21/10
See application file for complete search history.

(56) References Cited

U.S. PATENT DOCUMENTS

| 4,837,721 A | 6/1989 | Carmichael et al. |
| 5,088,057 A * | 2/1992 | Amrany .................... G06F 7/68 377/48 |
| 5,557,224 A | 9/1996 | Wright et al. |
| 5,920,211 A | 7/1999 | Anderson et al. |
| 6,614,319 B2 | 9/2003 | Sacki et al. |
| 6,861,881 B1 | 3/2005 | Neravetla et al. |
| 7,035,369 B2 * | 4/2006 | Bourdeau .............. H03K 23/52 377/47 |
| 7,098,715 B2 * | 8/2006 | Severson ............. H03K 5/1565 327/24 |
| 7,369,001 B2 | 5/2008 | Yu |
| 7,734,001 B2 | 6/2010 | Sacki |
| 8,081,017 B2 * | 12/2011 | Shibayama ............... G06F 1/08 327/115 |

(Continued)

FOREIGN PATENT DOCUMENTS

| JP | 2001-292058 | 10/2001 |
| JP | 2006-268617 | 10/2006 |
| KR | 1020100075001 A | 7/2010 |

(Continued)

*Primary Examiner* — Patrick O'Neill
(74) *Attorney, Agent, or Firm* — Myers Bigel Sibley & Sajovec, P.A.

(57) ABSTRACT

A clock dividing device includes an accumulator that accumulates a first accumulated value and a denominator value and stores a second accumulated value, a register that stores a delayed accumulated value obtained by delaying the second accumulated value, a first comparison operation unit that performs a comparative operation on the second accumulated value and a numerator value and stores the second accumulated value as a greater value if the second accumulated value is greater than or equal to the numerator value, a second comparison operation unit that performs a comparative operation on the delayed accumulated value and the numerator value and stores the delayed accumulated value as a delay greater value if the delayed accumulated value is greater than or equal to the numerator value, and a third comparison operation unit that performs a comparative operation on the greater value and the delay greater value and determines the shape of a clock, wherein the shape of the clock is one of a bypass, a rising edge, and a falling edge.

20 Claims, 11 Drawing Sheets

(56) References Cited

U.S. PATENT DOCUMENTS

| | | | |
|---|---|---|---|
| 8,867,696 B2 * | 10/2014 | Regimbal | H03K 5/156 327/115 |
| 2009/0201094 A1 | 8/2009 | Ohtsuka | |

FOREIGN PATENT DOCUMENTS

| | | |
|---|---|---|
| KR | 1020110039019 A | 4/2011 |
| KR | 1020120014834 A | 2/2012 |

* cited by examiner

2000

3000

CLOCK DIVIDING DEVICE

CROSS-REFERENCE TO RELATED APPLICATION

This application claims priority under 35 U.S.C. §119 from Korean Patent Application No 10-2014-0017222, filed on Feb. 14, 2014 in the Korean Intellectual Property Office, the content of which is incorporated by reference herein in its entirety.

BACKGROUND

A clock divider is a device that receives an input signal having a certain frequency and outputs an output signal having a lower frequency than the input signal. A ratio of the frequency of the input signal to the frequency of the output signal may or may not be an integer ratio. The clock divider may be implemented using a flip-flop.

SUMMARY

The inventive concepts provide a clock dividing device that may be used to generate an output clock having a division ratio MN (where M≥N) with respect to the frequency of an input clock and a 50% duty ratio.

The above and other objects of the inventive concepts will be described in or be apparent from the following description of the example embodiments.

According to an aspect of the inventive concepts, there is provided, a clock dividing device that includes an accumulator that is configured to sum a first accumulated value and a denominator value to generate a second accumulated value, a first comparison operation unit that is configured to perform a comparative operation on the second accumulated value and a numerator value and to store the second accumulated value as a greater value if the second accumulated value is greater than or equal to the numerator value and that is further configured to perform a comparative operation on a delayed accumulated value that is obtained, by delaying the second accumulated value and the numerator value and to store the delayed accumulated value as a delayed greater value if the delayed accumulated value is greater than or equal to the numerator value; and a second comparison operation unit that is configured to perform a comparative operation on the greater value and the delayed greater value and to determine a shape of a clock as one of a bypass, a rising edge, and a falling edge, where the numerator value is the value of a numerator of a frequency division ratio of the clock dividing device and the denominator value is a value of the denominator of the frequency division ratio of the clock dividing device.

According to another aspect of the present inventive concept, there is provided a clock dividing device that includes a first accumulator that is configured to sum a first accumulated value and a denominator value to generate a second accumulated value; a second accumulator that is configured to subtract a numerator value from the second accumulated value if the second accumulated value is greater than or equal to the numerator value; a first register that is configured to store a delayed accumulated value that is obtained by delaying the second accumulated value; a first comparison operation unit that is configured to perform a comparative operation on the second accumulated value and the numerator value and to perform a comparative operation on the delayed accumulated value and the numerator value; a second register that is configured to store the second accumulated value as a greater value when the second accumulated value is greater than or equal to the numerator value and to store the delayed accumulated value as a delayed greater value when the delayed accumulated value is greater than or equal to the numerator value; a second comparison operation unit that is configured to perform a comparative operation on the greater value and the delayed greater value to determine the shape of a clock; a third comparison operation unit that is configured to perform a comparative operation on the second accumulated value and the greater value; and a third register that is configured to store a falling value at a high level when the second accumulated value is greater than or equal to ½ of the greater value, where the shape of the clock is one of a bypass, a rising edge and a failing edge, and where the numerator value is the value of a numerator of a frequency division ratio of the clock dividing device and the denominator value is a value of the denominator of the frequency division ratio of the clock dividing device.

According to another aspect of the present inventive concept, there is provided a clock dividing device that includes an accumulator that is configured to sum an accumulated value and a denominator of a frequency division ratio of the clock dividing device to generate a new accumulated value; a first comparison operation unit that is configured to compare the new accumulated value to a numerator of the frequency division ratio of the clock dividing device to generate a greater value that is the greater of the new accumulated value and the numerator; and a second comparison operation unit that is configured to compare the greater value to the numerator and to compare a delayed greater value to the numerator and to use the result of these comparisons to determine a shape of a clock that is output by the clock dividing device.

DETAILED DESCRIPTION OF THE EMBODIMENTS

The inventive concepts will now be described more fully hereinafter with reference to the accompanying drawings, in which preferred embodiments thereof are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions may be exaggerated for clarity.

The use of the terms "a" and "an" and the and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better explain the inventive concepts and is not a limitation on the scope of the inventive concepts unless otherwise specified.

Figure 1:
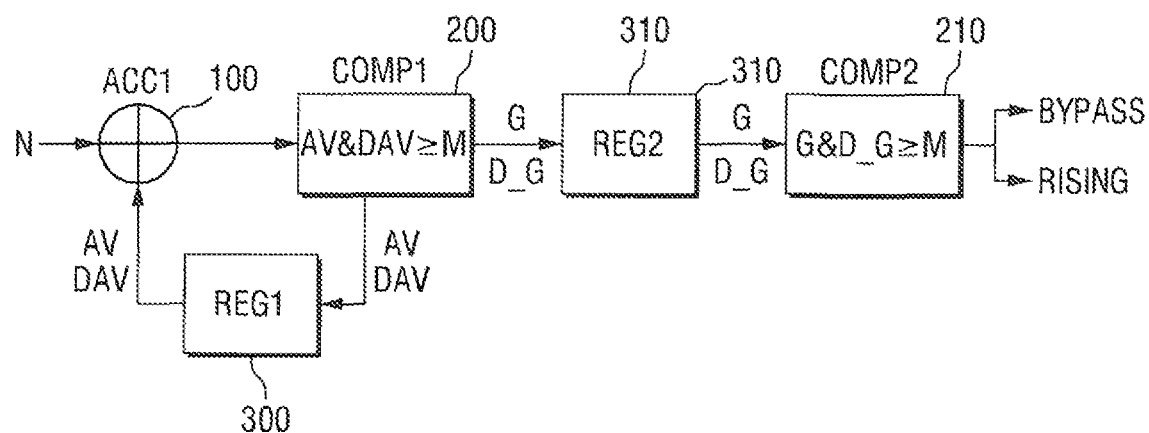
FIG. 1 is a partial block diagram of a clock dividing device according to a first embodiment of the inventive concepts.
Figure 2:
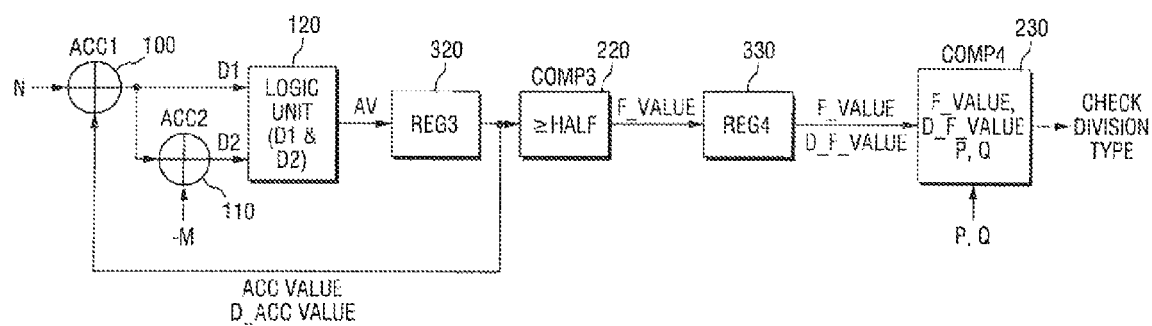
FIG. 2 is another partial block diagram of the clock dividing device according to the first embodiment of the inventive concepts.
Figure 3:
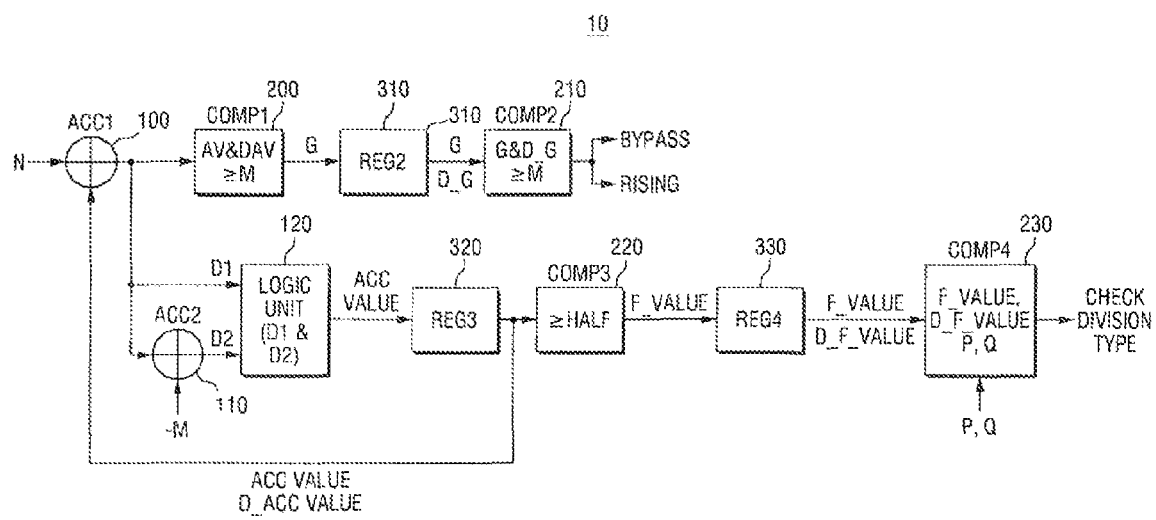
FIG. 3 is a block diagram of the clock dividing device according to the embodiment of the inventive concepts.
Figure 4:
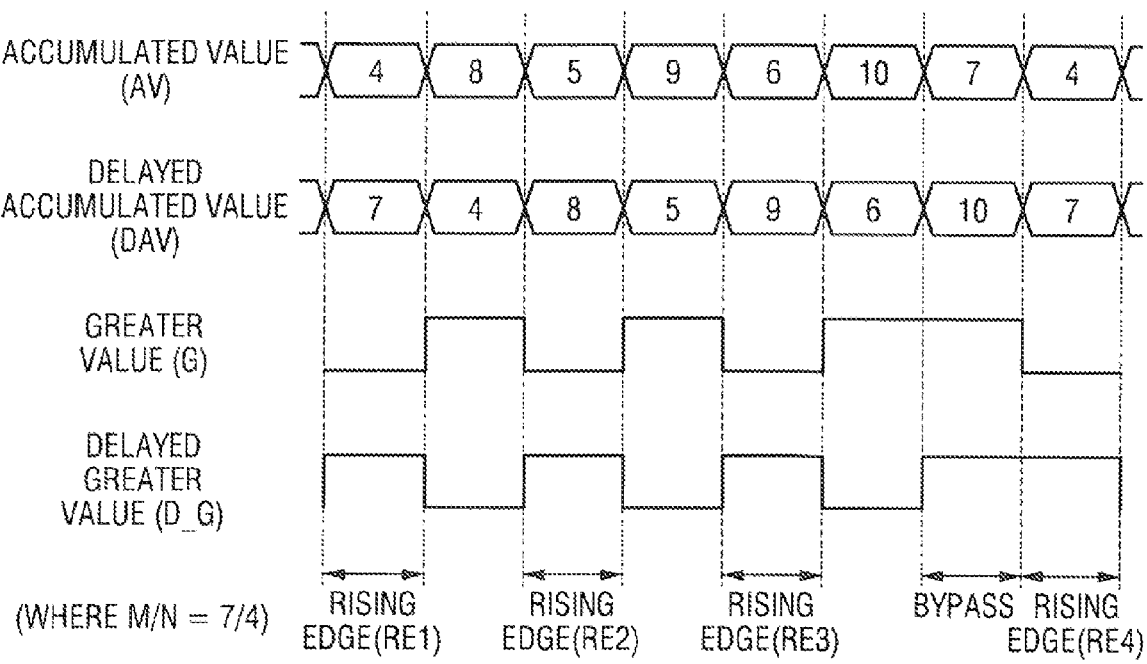
FIGS. 4 and 5 are timing diagrams illustrating operation of the clock dividing device shown in FIG. 3.
Figure 5:
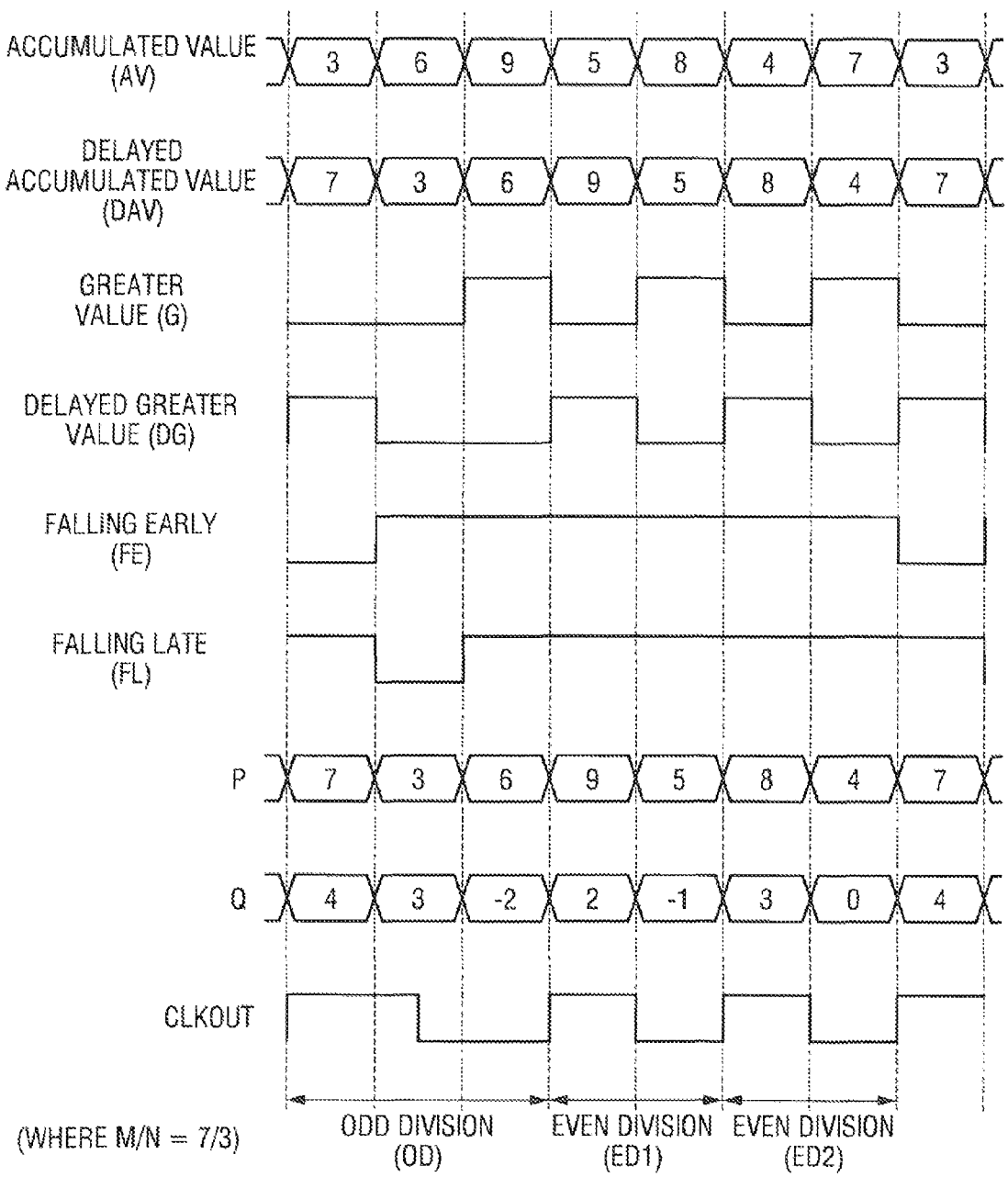
Figure 6:
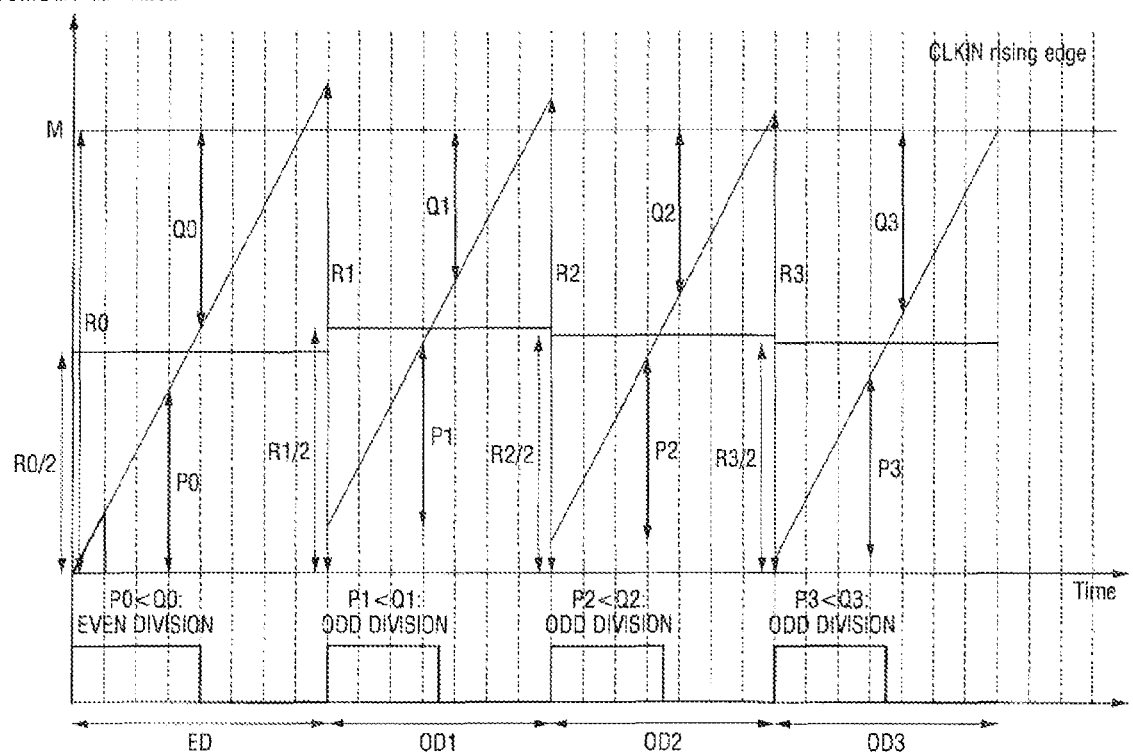
FIG. 6 is a time graph for explaining even/odd types of a clock.

Hereinafter, a clock dividing device 10 according to a first embodiment of the inventive concepts will be described with reference to FIGS. 1 to 6. FIGS. 1 and 2 are partial block diagrams of the clock dividing device 10. FIG. 3 is a full block diagram of the clock dividing device 10. FIGS. 4 and 5 are timing diagrams illustrating changes that occur to various of the signals generated in the clock dividing device 10. Finally, FIG. 6 is a time graph for explaining even/odd types of a clock.

Referring to FIGS. 1 to 3, the clock dividing device 10 includes a first accumulator 100, a second accumulator 110, a logic unit 120, a first comparison operation unit 200, a first register 300, a second register 310, a second comparison operation unit 210, a third register 320, a third comparison operation unit 220, a fourth register 330, and a fourth comparison operation unit 230.

The clock dividing device 10 generates an output clock having a frequency that has a division ratio M≥N (where M≥N) with respect to the frequency of an input clock and a 50% duty ratio. The shape of the output clock may be determined based, for example, on various operations that are described below. Examples of the shape of the output clock include a bypass, a rising edge and a falling edge.

FIG. 1 is a partial block diagram of the clock dividing device 10. The portion of the clock dividing device 10 illustrated in FIG. 1 may be used to determine the shape of the output clock as a bypass or a rising edge.

Operations performed by the first accumulator 100, the first comparison operation unit 200, the first register 300, the second register 310, and the second comparison operation unit 210 will now be described with reference to FIGS. 1 and 4.

The first accumulator 100 sums an accumulated value AV (e.g., a first accumulated value) that is output from the first register 300 and a denominator value N to obtain a new accumulated value (e.g., a second accumulated value) which is stored in the first accumulator 100. In the description that follows, it is assumed that the division ratio far the clock dividing device 10 is M/N (M≥N), where M is the numerator value of the division ratio and N is the denominator value of the division ratio. Assuming, for example, that the first accumulated value is 4 and that the denominator value N is 4, the first accumulator 100 sums these values to obtain a second accumulated value of 8, which value is stored in the first accumulator 100.

Next, the first comparison operation unit 200 compares the second accumulated value (i.e., the current value of the accumulated value that is stored in the first accumulator 100) to the numerator value M. If the accumulated value is greater than or equal to the numerator value M, the first comparison operation unit 200 subtracts the numerator value M from the accumulated value and passes the result of this subtraction operation to the first register 300. If the accumulated value is less than or equal to the numerator value M, then the accumulated value may be transmitted to the first register 300 without subtracting the numerator value M therefrom. The value that is transmitted to the first register 300 is considered to be the accumulated value (i.e., in cases where M is subtracted from the accumulated value as described above the result of this subtraction operation is still referred to as the accumulated value). Continuing with the example from above in which a second accumulated value (which is a value of 8) is stored in the first accumulator 100, when the numerator value M is 7, the first comparison operation unit 200 compares the numerator value M with the second accumulated value (i.e., 8). Since the second accumulated value 8) is greater than or equal to the numerator value M (i.e., 7), the first comparison operation unit 200 subtracts the numerator value M from the second accumulated value and passes the result of this subtraction operation (i.e., the value 1) to the first register 300. This value that is passed to the first register (i.e, the value 1) is considered to be the new value of the second accumulated value.

The first comparison operation unit 200 also compares a delayed accumulated value DAV to the numerator value M. The delayed accumulated value DAV is a value that is obtained by delaying the accumulated value by one cycle. In other words, the delayed accumulated value DAV is the immediately preceding value of the accumulated value. Thus, in the above example where the second accumulated value is 8, the delayed accumulated value is equal to the first accumulated value, or 4. When the first comparison operation unit 200 compares the delayed accumulated value DAV to the numerator value M, if the delayed accumulated value is greater than or equal to the numerator value M, the first comparison operation unit 200 subtracts the numerator value M from the delayed accumulated value and passes the result of this subtraction operation to the first register 300 as the new value for the delayed accumulated value. If the delayed accumulated value is less than or equal to the numerator value, then the delayed accumulated value may be transmitted to the first register 300 without subtracting the numerator value M therefrom. Referring to FIG. 4, in the present example, when the second accumulated value is 8, the delayed accumulated value DAV is 4. Since the delayed accumulated value DAV (i.e., 4) is smaller than the numerator value M (i.e., 7), the delayed accumulated value is transmitted to the first register 300 without subtracting the numerator value M therefrom.

The first register 300 stores the accumulated value and the delayed accumulated value that are received from the first comparison operation unit 200 and transmits these values back to the first accumulator 100 so that the above operations may be repeated to generate subsequent accumulated values (e.g., a third accumulated value, a fourth accumulated value, etc.) and delayed accumulated values.

The first comparison operation unit 200 also passes a greater value G and a delayed greater value D_G to the second register 310. The greater value G is the greater value of the accumulated value AV and the numerator value M that are compared by the first comparison operation unit 200. The delayed greater value D_G is the previous greater value G. The second register 310 transmits the greater value G and the delayed greater value D_G to the second comparison operation unit 210.

The second comparison operation unit 210 performs comparative operations on both the greater value G and on the delayed greater value D_G and determines the clock shape of the output clock based on the results of these comparative operations. In particular, if the greater value G is greater than or equal to M, then the greater value G is considered to be at a high level and, if not, the greater value G is considered to be at a low level. Similarly, if the delayed greater value D_G is greater than or equal to M, then the delayed greater value D_G is considered to be at a high level and, if not, the delayed greater value D_G is considered to be at a low level. As shown in FIG. 4, if both the greater value G and the delayed greater value D_G are at the high level, then the second comparison operation unit 210 sets the shape of the output clock as a bypass. In contrast, if the greater value G is at a low level and the delayed greater value D_G is at a high level, the second comparison operation unit 210 sets the shape of the output clock as a rising edge.

By way of example, in the first cycle illustrated in the example of FIG. 4, the accumulated value AV is 4 and the delayed accumulated value DAV is 7. In this cycle, the accumulated value AV (4) is smaller than M (7), and hence the greater value G is at the low level. Similarly, the delayed accumulated value DAV (7) is equal to M (7), and hence the delayed greater value D_G is at the high level. Therefore, the shape of the output clock is a rising edge REI. In contrast, as shown in the second to last cycle of the example of FIG. 4, the accumulated value AV is 7 and the delayed accumulated value DAV is 10. In this cycle, the accumulated value AV (7) and the delayed accumulated value DAV (10) are both greater than or equal to M (7), and hence both the greater value G and the delayed greater value D_G are at the high level. In this case, therefore, the shape of the output clock is a bypass.

Referring now to FIGS. 2-3 and 5-6, operation of the second accumulator 110, the logic unit 120, the third register 320, the third comparison operation unit 220, the fourth register 330 and the fourth comparison operation unit 230 will now be described.

The second accumulator 110 subtracts the numerator value M from the accumulated value that is received from the first accumulator 100 if the accumulated value is greater than or equal to the numerator value M. That is to say, the second accumulator 110 subtracts the numerator value M from the accumulated value if the greater value is at a high level. The second accumulator 110 may be provided in embodiments in which the first comparison operation unit 200 does not include a subtraction circuit. The second accumulator 110 transmits a value D2 that is obtained by subtracting the numerator value M from the accumulated value to the logic unit 120.

The logic unit 120 compares the accumulated value, which is labelled D1 in FIGS. 2 and 3, that is transmitted from the first accumulator 100 with the value D2 that is transmitted from the second accumulator 110. The logic unit 120 transmits the smaller of the values D1 and D2 (which by definition will be smaller than the numerator value M) to the first accumulator 100 through the third register 320 and transmits the greater of the values D1 and D2 (which is greater than the numerator value M) to the third comparison operation unit 220 through the third register 320. Thus, the value D1 that is transmitted to the third comparison operation unit 220 through the third register is the current value of the accumulated value. Referring to FIG. 5, for example, when the accumulated value AV is 9 and the numerator value M is 7, the value D1 that is transmitted from the first accumulator 100 is 9 and the value D2 that is transmitted from the second accumulator 110 is 2. Thus, 2, which is smaller than the numerator value M (i.e., 7), is transmitted to the first accumulator 100 through the third register 320, and the value 9, which is greater than or equal to the numerator value M (i.e., 7), is transmitted to the third comparison operation unit 220 through the third register 320. However, when D1 is smaller than the numerator value M, the value D1 is transmitted to the first accumulator 100 through the third register 320 instead of the value D2.

The third register 320 stores the values D1 and D2 that are received from the logic unit 120 and transmits the current value of the accumulated value D1 to the third comparison operation unit 220 and transmits the value D2 (or the value D1, if D1 is smaller than M) to the first accumulator 100.

The third comparison operation unit 220 performs a comparative operation on the value D1 that is received from the third register 320 and the immediately previous greater value (the immediately previous greater value is the larger of the immediately previous accumulated value AV and the numerator M). In particular, the third comparison operation unit 220 determines whether the current value of the accumulated value is greater than or equal to ½ of the immediately previous greater value. If the current value of the accumulated value is greater than or equal to ½ of the immediately previous greater value, a falling value F_VALUE that is transmitted to the fourth register 330 from the third comparison operation unit 220 is set or maintained at a high level. For example, referring to FIG. 5, when the accumulated value AV is 3, which is smaller than ½ of the immediately previous greater value, i.e., 7, the falling value F_VALUE is set to or maintained at a low level. When the current value of the accumulated value AV is 6, which is greater than ½ of the immediately previous greater value, i.e., 7, the falling value F_VALUE is set to or maintained at a high level. The falling value F_VALUE is shown in FIG. 5 as a falling early value FE. When the current value of the accumulated value AV is greater than or equal to the immediately previous greater value, the falling value F_VALUE is maintained at a high level. Accordingly, a timing diagram for the falling early value (FE) is produced. A timing diagram of a falling late value (FL) is produced by delaying the timing diagram for the falling early signal (FE) by one cycle.

Referring again to FIG. 2, the fourth register 330 receives the falling value F_VALUE from the third comparison operation unit 220, stores the same and transmits the falling value F_VALUE and a delayed falling value D_F_VALUE to the fourth comparison operation unit 230.

The fourth comparison operation unit 230 receives the falling value F_VALUE, the delayed falling value D_F_VALUE, a delayed accumulated value P (which is the same as DAV) and an accumuerable value Q and determines the type of the output clock. The output clock may be either an even type or an odd type. The accumuerable value Q is a value that is obtained by subtracting the accumulated value AV from the numerator value M. Referring to FIG. 6, the accumuerable value Q is indicated by Q0 to Q3. As shown in FIG. 5, when the numerator value M is 7 and the accumulated value AV is 3, the accumuerable value Q is 4, when the accumulated value AV is 6, the accumuerable value Q is equal to 1, and when the accumulated value AV is 9, the accumuerable value Q is equal to −2.

A method of determining the type of the output clock will now be described. When the falling value F_VALUE is at a high level, the delayed falling value D_F_VALUE is at a low level and the delayed accumulated value P is smaller than the accumuerable value Q, the output clock is of an even type. In addition, irrespective of the value of the falling value F_VALUE, when the delayed falling value D_F_VALUE is at a high level the output clock is of an even type. In contrast, when the falling value F_VALUE is at a high level, the delayed falling value D_F_VALUE is at a low level, and the delayed accumulated value P is greater than or equal to the accumuerable value Q, the output clock is of an odd type. Referring to FIG. 5, the first output clock CLKOUT is of an odd type, and the second and third output clocks CLKOUT are of an even type.

Figure 7:
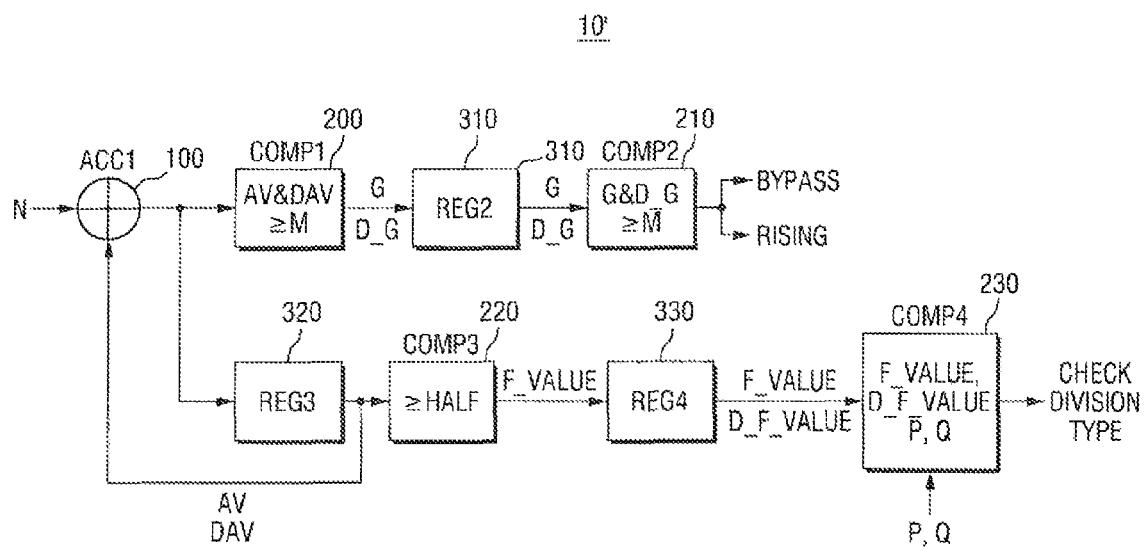
FIG. 7 is a block diagram of a clock dividing device according to a second embodiment of the inventive concepts.

FIG. 7 is a block diagram of a clock dividing device 10' according to another embodiment of the inventive concepts. For the sake of brevity, substantially the same components as those of the clock dividing device 10 according to the previous embodiment will not be described.

Referring to FIG. 7, the clock dividing device 10' includes a first accumulator 100, a first comparison operation unit 200, a second register 310, a third register 320, a second comparison operation unit 210, a third comparison operation unit 220, a fourth register 330, and a fourth comparison operation unit 230.

The first accumulator 100 sums an accumulated value that is received from the third register 320 and a denominator value N to obtain a new accumulated value and this new accumulated value is stored in the first accumulator 100.

The first comparison operation unit 200 performs a comparative operation on the accumulated value that is received from the first accumulator 100 and a numerator value M, and likewise performs a comparative operation on a delayed accumulated value and the numerator value M. In addition, the first comparison operation unit 200 further includes a subtraction circuit. If the accumulated value is greater than or equal to the numerator value M, the first comparison operation unit 200 uses the above-referenced subtraction circuit to subtract the numerator value M from the accumulated value and passes the result of this subtraction to the third register 200 as a new value for the accumulated value. If the accumulated value is less than or equal to the numerator value M, then the accumulated value may be transmitted to the third register 200 without subtracting the numerator value M therefrom. The first comparison operation unit 200 also transmits the greater value G (which is the larger of the accumulated value AV and the numerator M) to the second register 310. Thus, for example, when the accumulated value is 8 and the numerator value M is 7, the first comparison operation unit 200 transmits 1, which is obtained by subtracting 7 as the numerator value M from 8, to the third register 320 and transmits the accumulated value 8 as the greater value G to the second register 310. If the accumulated value is not the greater value (i.e., if it is smaller than M), the first comparison operation unit 200 transmits the accumulated value to the third register 320 as it is. The same operations may also be performed by the first comparison operation unit 200 on the delayed accumulated value.

The second register 310 receives the greater value G and the delayed greater value D_G from the first comparison operation unit 200, stores the same, and transmits the greater value G and the delayed greater value D_G to the second comparison operation unit 210 and the third comparison operation unit 220.

The third register 320 stores the values received from the first comparison operation unit 200 and transmits the values stored therein to the first accumulator 100 and the third comparison operation unit 220.

The second comparison operation unit 210 performs a comparative operations on both the greater value G and the delayed greater value D_G and determines the shape of the output clock based on the results of these comparative operations. In particular, if the greater value G is greater than or equal to M, then the greater value G is considered to be at a high level and, if not, the greater value G is considered to be at a low level. Similarly, if the delayed greater value D_G is greater than or equal to M, then the delayed greater value D_G is considered to be at a high level and, if not, the delayed greater value D_G is considered to be at a low level. If both the greater value G and the delayed greater value D_G are at the high level, then the second comparison operation unit 210 sets the shape of the output clock as a bypass. In contrast, if the greater value G is at a low level and the delayed greater value D_G is at a high level, the second comparison operation unit 210 sets the shape of the output clock as a rising edge.

The third comparison operation unit 220 performs comparative operations on the values received from the second register 310 and the third register 320 and the immediately previous greater value to determine whether the current value of the accumulated value is greater than or equal to ½ of the immediately previous greater value. If the current value of the accumulated value is greater than or equal to ½ of the immediately previous greater value, a falling value F_VALUE is maintained at a high level. The falling value F_VALUE is transmitted to the fourth register 330.

The fourth register 330 receives the falling value F_VALUE from the third comparison operation unit 220, stores the same and transmits the falling value F_VALUE and the delayed falling value D_F_VALUE to the fourth comparison operation unit 230.

The fourth comparison operation unit 230 receives the falling value F_VALUE, the delayed falling value D_F_VALUE, a delayed accumulated value P and the accumuerable value Q and determines the type of the output clock.

Hereinafter, a clock dividing method according to an embodiment of the inventive concepts will be described.

Figure 8:
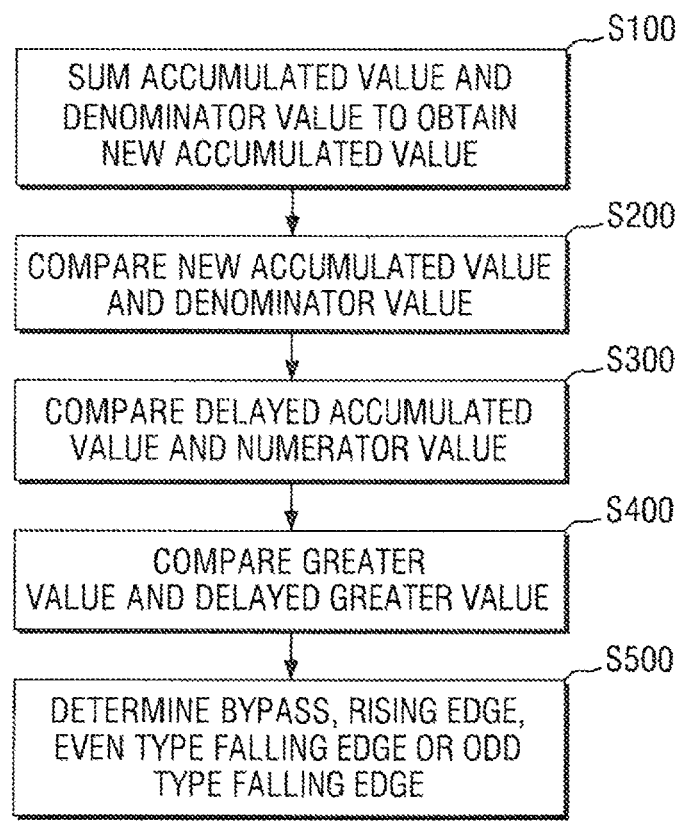
FIG. 8 is a flow chart illustrating a clock dividing method according to an embodiment of the inventive concepts.

FIG. 8 is a flow chart for explaining a clock dividing method according to an embodiment of the inventive concepts.

Referring to FIG. 8, first, a first accumulated value and a denominator value N are summed (S100). For example, when the first accumulated value is 6 and the denominator value N is 3, these values are summed to obtain a second accumulated value having a value of 9.

Next, the second accumulated value and a numerator value M are compared (S200). For example, when the second accumulated value is 9, it is compared with the numerator value M and when the second accumulated value is greater than or equal to the numerator value M, the second accumulated value becomes a greater value.

Next, the delayed accumulated value and the numerator value M are compared (S300). The delayed accumulated value is a value obtained by delaying the accumulated value and an operation is performed on the delayed accumulated value in the same manner as the comparing of the second accumulated value with the numerator value M.

Next, the greater value G and the delayed greater value D_G are compared (S400). As the result of the comparisons of the greater value G and the delayed greater value D_G, the shape of the output clock may be determined.

Then, one of a bypass, a rising edge, an even type falling edge, and an odd type falling edge is determined as the shape of the output clock (S500). The shape of the output clock may be determined in the same manner as described above.

Figure 9:
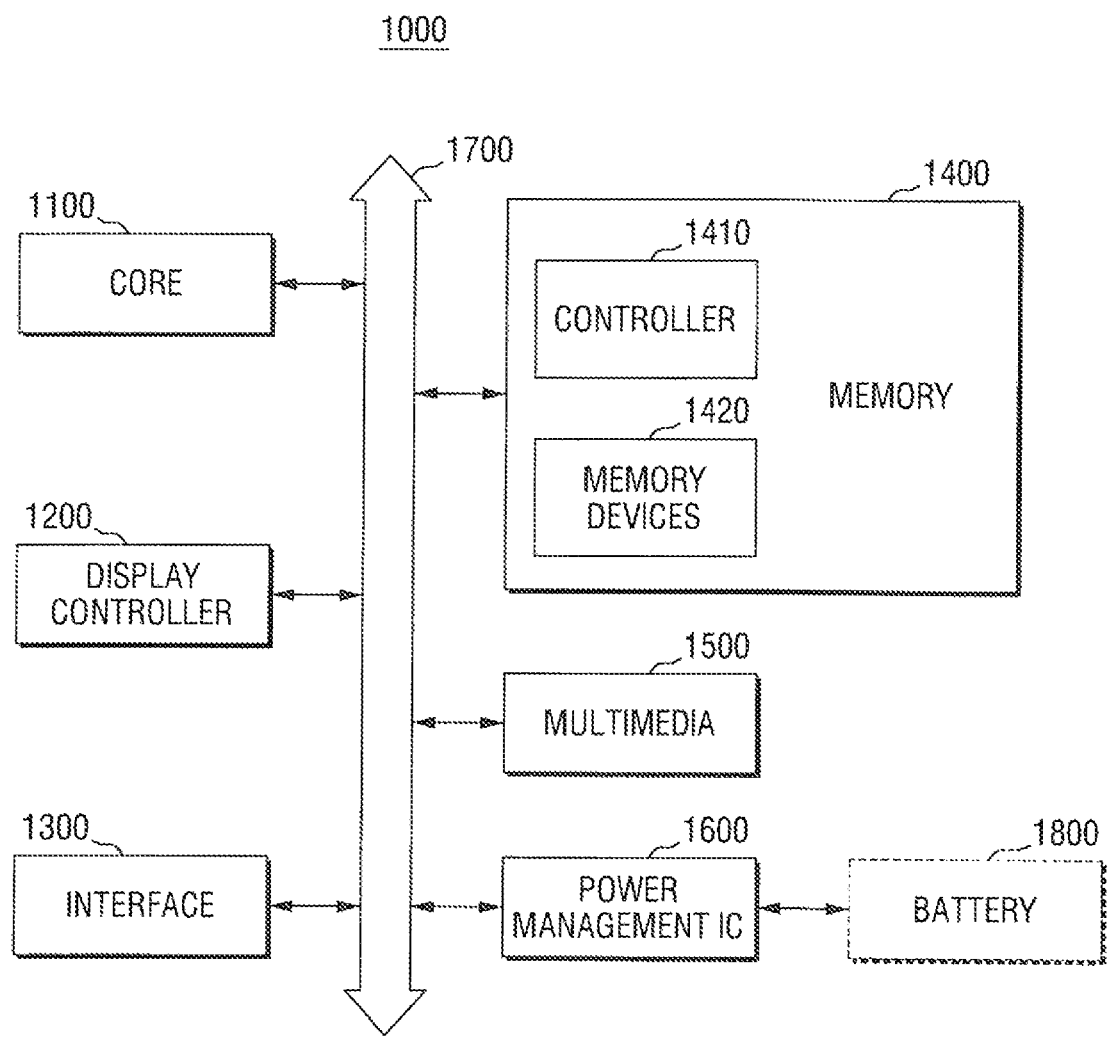
FIG. 9 is a block diagram of a system including a clock dividing device according to an embodiment of the inventive concepts.

FIG. 9 is a block diagram of a system including a clock dividing device according to an embodiment of the inventive concepts.

Referring to FIG. 9, the system 1000 may include a core processor (CORE) 1100, a display controller 1200, an interface device (INTERFACE) 1300, a memory device (MEMORY) 1400, a peripheral device (PERIPHERAL) 1500, and a power management device 1600.

The core processor 1100, the display controller 1200, the interface device 1300, the memory device 1400, the peripheral device 1500 and the power management device 1600 may be connected to each other through a system bus 1700. The system bus 1700 may correspond to a path through which data moves.

The core processor 1100 may include a single core processor or a plurality of core (multi core) processors. For example, the core processor 1100 may include a multi core processor, such as a dual core processor, a quad core processor, or a hexa core processor. Although not specifically shown in FIG. 9, the core processor 1100 may further include a cache memory positioned inside or outside the core processor.

The display controller 1200 controls a display device to display a picture or an image.

The interface device 1300 may transmit data to a communication network or may receive data from the communication network. For example, the interface device 1300 may include an antenna or a wired/wireless transceiver.

The memory device 1400 may be configured to store commands and/or data. The memory device 1400 may include one memory controller 1410 and a plurality of memory devices 1420. The memory devices 1420 may be connected to the memory controller 1410 through the respective channels. Each of the memory devices 1420 may include at least one memory chip.

For example, the memory device 1400 may include a volatile memory device, such as a static random access memory (SRAM) or a dynamic random access memory (DRAM), or a non-volatile memory device, such as a Read Only Memory (ROM), an electrically erasable and programmable ROM (EEPROM), or a flash memory, but not limited thereto.

The peripheral device 1500 may include various devices, such as a serial communication device, a memory management device, an audio processor, and so on.

The power management device 1600 may supply power to the core processor 1100, the display controller 1200, the interface device 1300, the memory device 1400 and the peripheral device 1500. The power management device 1600 may be connected to a battery 1800 and may be supplied with a power voltage from the battery 1800.

Figure 10:
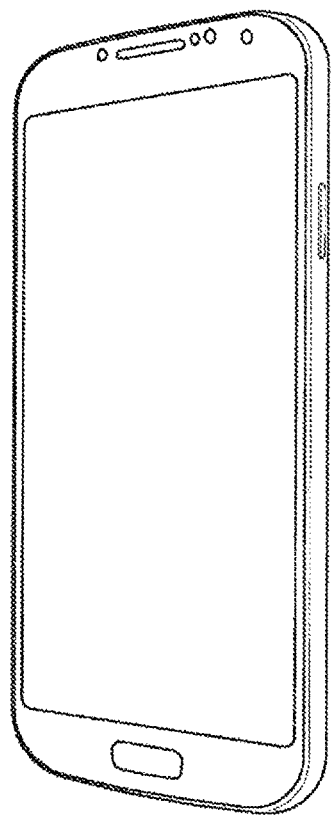
FIGS. 10 and 11 illustrate exemplary electronic devices to which the system shown in FIG. 9 may be applied.
Figure 11:
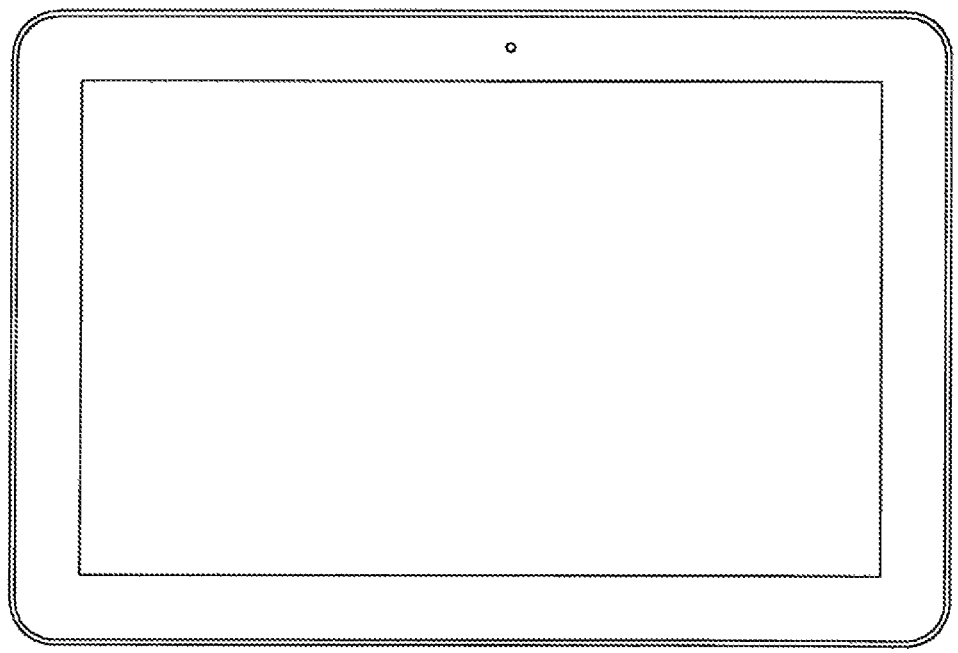

FIGS. 10 and 11 illustrate exemplary electronic devices to which the system shown in FIG. 9 may be applied. Specifically, FIG. 10 illustrates a smart phone 2000 and FIG. 11 illustrates a tablet PC 3000.

The system 1000 shown in FIG. 9 may be provided as a component (e.g., a system on chip (SOC)) of an arbitrary portable system, such as the smart phone 2000 or the tablet PC 3000.

The system 1000 may also be applied to other electronic devices not illustrated herein. For example, the system 1000 may be provided as a computer, an ultra mobile personal computer (UMPC), a work station, a net-book, a personal digital assistant (PDA), a portable computer, a web tablet, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded computing systems.

In the description above, various logical units such as registers, comparative operation units and the like are described. Some of these logical units may be configured to perform multiple operations (e.g., the second comparative operation unit 210 performs operations on both the accumulated value and the delayed accumulated value). It will be appreciated that these logical units may be implemented as a single unit that performs multiple operations or as multiple units that together implement the functionality of the logical unit without departing from the scope of the inventive concepts. It will also be appreciated that various of the operations may be performed at different of the logical units that as described above while still carrying out the methods of the inventive concepts.

While the inventive concepts have been shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A clock dividing device comprising:
an accumulator that is configured to sum a first accumulated value and a denominator value to generate a second accumulated value;
a first comparison operation unit that is configured to perform a comparative operation on the second accumulated value and a numerator value and to store the second accumulated value as a greater value if the second accumulated value is greater than or equal to the numerator value and that is further configured to perform a comparative operation on a delayed accumulated value that is obtained by delaying the second accumulated value and the numerator value and to store the delayed accumulated value as a delayed greater value if the delayed accumulated value is greater than or equal to the numerator value; and
a second comparison operation unit that is configured to perform a comparative operation on the greater value and the delayed greater value to determine a shape of a clock as one of a bypass, a rising edge, and a falling edge, wherein the numerator value is a value of a numerator of a frequency division ratio of the clock dividing device and the denominator value is a value of a denominator of the frequency division ratio of the clock dividing device.

2. The clock dividing device of claim 1, wherein a type of the falling edge clock is determined using the first and second accumulated values as an even type falling edge clock or an odd type falling edge clock.

3. The clock dividing device of claim 2, further comprising a third comparison operation unit that is configured to perform a comparative operation on the second accumulated value and the greater value and to store a falling value at a high level when the second accumulated value is greater than or equal to ½ of the greater value.

4. The clock dividing device of claim 3, further comprising a fourth comparison operation unit that is configured to store a delayed falling value that is obtained by delaying the falling value and to perform a comparative operation on the falling value and the delayed falling value to determine the type of the falling edge clock.

5. The clock dividing device of claim 4, wherein the fourth comparison operation unit is configured to determine the type of the falling edge clock using the delayed accumulated value and an accumuerable value, where the accumuerable value is obtained by subtracting the second accumulated value from the numerator value.

6. The clock dividing device of claim 1, wherein the second comparison operation unit is configured to determine the shape of the clock as a bypass when the greater value and the delayed greater value are at high levels.

7. The clock dividing device of claim 1, wherein the second comparison operation unit is configured to determine the shape of the clock as a rising edge when the greater value is at a low level and the delayed greater value is at a high level.

8. The clock dividing device of claim 1, wherein the second comparison operation unit is configured to determine the shape of the clock as a falling edge when the greater value and the delayed greater value are at low levels or when the greater value is at a high level and the delayed greater value is at a low level.

9. A clock dividing device comprising:
a first accumulator that is configured to sum a first accumulated value and a denominator value to generate a second accumulated value;
a second accumulator that is configured to subtract a numerator value from the second accumulated value if the second accumulated value is greater than or equal to the numerator value;
a first register that is configured to store a delayed accumulated value that is obtained by delaying the second accumulated value by at least one cycle;
a first comparison operation unit that is configured to perform a comparative operation on the second accumulated value and the numerator value and to perform a comparative operation on the delayed accumulated value and the numerator value;
a second register that is configured to store the second accumulated value as a greater value when the second accumulated value is greater than or equal to the numerator value and to store the delayed accumulated value as a delayed greater value when the delayed accumulated value is greater than or equal to the numerator value;
a second comparison operation unit that is configured to perform a comparative operation on the greater value and the delayed greater value to determine a shape of a clock;
a third comparison operation unit that is configured to perform a comparative operation on the second accumulated value and the greater value; and
a third register that is configured to store a falling value at a high level when the second accumulated value is greater than or equal to ½ of the greater value,
wherein the shape of the clock is one of a bypass, a rising edge and a falling edge, and
wherein the numerator value is a value of a numerator of a frequency division ratio of the clock dividing device and the denominator value is a value of a denominator of the frequency division ratio of the clock dividing device.

10. The clock dividing device of claim 9, wherein the clock is of an even or odd type and the type of the clock is determined using the first and second accumulated values.

11. The clock dividing device of claim 10, further comprising a fourth comparison operation unit that is configured to determine the type of the clock using the falling value, the delayed falling value obtained by delaying the falling value, the delayed accumulated value, and an accumuerable value, where the accumuerable value is obtained by subtracting the second accumulated value from the numerator value.

12. The clock dividing device of claim 11, wherein the fourth comparison operation unit is configured to determine the clock as an odd type when the falling value is at a high level and the delayed falling value is at a low level and when the delayed accumulated value is greater than or equal to the accumuerable value.

13. The clock dividing device of claim 9, wherein the second comparison operation unit is configured to determine the shape of the clock as a bypass when the greater value and the delayed greater value are at high levels.

14. The clock dividing device of claim 9, wherein the second comparison operation unit is configured to determine the shape of the clock as a rising edge when the greater value is at a low level and the delayed greater value is at a high level.

15. The clock dividing device of claim 9, wherein the second comparison operation unit is configured to determine the shape of the clock as a falling edge when the greater value and the delayed greater value are at low levels or when the greater value is at a high level and the delayed greater value is at a low level.

16. A clock dividing device, comprising:
an accumulator that is configured to sum an accumulated value and a denominator of a frequency division ratio of the clock dividing device to generate a new accumulated value;
a first comparison operation unit that is configured to compare the new accumulated value to a numerator of the frequency division ratio of the clock dividing device to generate a greater value that is the greater of the new accumulated value and the numerator;
a second comparison operation unit that is configured to compare the greater value to the numerator and to compare a delayed greater value to the numerator and to use the result of these comparisons to determine a shape of a clock that is output by the clock dividing device.

17. The clock dividing device of claim 16, wherein the shape of the clock is one of a bypass, a rising edge and a falling edge.

18. The clock dividing device of claim 17, further comprising a circuit that determines a type of the clock if the clock has a falling edge shape as an even type falling edge clock or an odd type falling edge clock.

19. The clock dividing device of claim 18, further comprising a third comparison operation unit that is configured to set a falling value at a first level if the accumulated value is greater than or equal to ½ of the greater value, wherein the circuit that determines the type of the clock uses the falling value to determine if the clock is an even type falling edge clock or an odd type falling edge clock.

20. The clock dividing device of claim 16, wherein the second comparison operation unit is configured to determine the shape of the clock as a bypass when the greater value and the delayed greater value are at high levels, to determine the shape of the clock as a rising edge when the greater value is at a low level and the delay greater value is at a high level, and to determine the shape of the clock as a falling edge when the greater value and the delayed greater value are at low levels or when the greater value is at a high level and the delayed greater value is at a low level.

* * * * *